(12) United States Patent
Kuksenkov et al.

(10) Patent No.: US 11,805,673 B2
(45) Date of Patent: Oct. 31, 2023

(54) LIGHT EXTRACTION APPARATUS AND OLED DISPLAYS

(71) Applicant: Corning Incorporated, Corning, NY (US)

(72) Inventors: Dmitri Vladislavovich Kuksenkov, Elmira, NY (US); Nikolay Timofeyevich Timofeev, St. Petersburg (RU)

(73) Assignee: CORNING INCORPORATED, Corning, NY (US)

( * ) Notice: Subject to any disclaimer, the term of this patent is extended or adjusted under 35 U.S.C. 154(b) by 450 days.

(21) Appl. No.: 15/734,788

(22) PCT Filed: Jun. 6, 2018

(86) PCT No.: PCT/RU2018/000370
§ 371 (c)(1),
(2) Date: Dec. 3, 2020

(87) PCT Pub. No.: WO2019/235955
PCT Pub. Date: Dec. 12, 2019

(65) Prior Publication Data
US 2021/0234131 A1 Jul. 29, 2021

(51) Int. Cl.
*H10K 50/852* (2023.01)
*H10K 102/00* (2023.01)

(52) U.S. Cl.
CPC ... *H10K 50/852* (2023.02); *H10K 2102/3026* (2023.02); *H10K 2102/3035* (2023.02)

(58) Field of Classification Search
None
See application file for complete search history.

(56) References Cited

U.S. PATENT DOCUMENTS

| 8,659,221 B2 | 2/2014 | Jones et al. |
| 9,246,134 B2 | 1/2016 | Schwartz et al. |

(Continued)

FOREIGN PATENT DOCUMENTS

| CN | 1836343 A | 9/2006 |
| FR | 2858859 A1 | 2/2005 |

(Continued)

OTHER PUBLICATIONS

"F. Pschenitzka, "Light extraction technologies in organic light emitting devices for lighting applications", presentation at the DOE 2012 Solid-state lighting R&D workshop. http://apps1.eere.energy.gov/buildings/publications/pdfs/ssl/pschenitzka_technologies_2012rdworkshop.pdf".

(Continued)

*Primary Examiner* — Evren Seven
(74) *Attorney, Agent, or Firm* — Matthew J. Mason

(57) ABSTRACT

A light extraction apparatus for an organic light-emitting diode (OLED) includes an OLED emitter (100), a plurality of tapered reflectors (210), and a spacer layer (202). Each tapered reflector includes a first surface (212), a second surface (214) opposite to the first surface and comprising a surface area larger than a surface area of the first surface, and at least one side surface (216) extending between the first surface and the second surface. The spacer layer (202) includes a first surface coupled to the OLED emitter and a second surface coupled to the first surface of each of the plurality of tapered reflectors. Light emitted from the OLED passes through the spacer layer and into the plurality of tapered reflectors. The at least one side surface of each of the plurality of tapered reflectors includes a slope to redirect light into an escape cone and out of the second surface of the corresponding tapered reflector.

20 Claims, 8 Drawing Sheets

(56) References Cited

U.S. PATENT DOCUMENTS

| | | |
|---|---|---|
| 9,690,033 B2 | 6/2017 | Baker et al. |
| 9,741,777 B2 | 8/2017 | Wang |
| 9,799,853 B2 | 10/2017 | Lamansky et al. |
| 9,799,863 B2 | 10/2017 | Yokoyama et al. |
| 2004/0217702 A1 | 11/2004 | Garner et al. |
| 2007/0029560 A1* | 2/2007 | Su .................... H01L 33/44 257/E33.068 |
| 2007/0182297 A1 | 8/2007 | Drazic et al. |
| 2010/0013741 A1* | 1/2010 | Watanabe ............. H05B 33/10 345/32 |
| 2012/0155093 A1 | 6/2012 | Yagi et al. |
| 2012/0234460 A1 | 9/2012 | Zhang et al. |
| 2013/0021781 A1 | 1/2013 | Sonoda et al. |
| 2015/0228929 A1 | 8/2015 | Lamansky et al. |
| 2015/0228931 A1 | 8/2015 | Lamansky et al. |
| 2016/0197311 A1* | 7/2016 | Lamansky ............ B82Y 20/00 257/40 |
| 2017/0210531 A1 | 7/2017 | Wharton et al. |
| 2017/0301888 A1 | 10/2017 | Lamansky et al. |
| 2018/0114949 A1 | 4/2018 | Ishikawa et al. |
| 2019/0221780 A1 | 7/2019 | Ishikawa et al. |

FOREIGN PATENT DOCUMENTS

| | | |
|---|---|---|
| JP | 2004-259607 A | 9/2004 |
| JP | 2007-502515 A | 2/2007 |
| JP | 2010-108818 A | 5/2010 |
| JP | 2011-187239 A | 9/2011 |
| JP | 2013-058447 A | 3/2013 |
| TW | 201326973 A | 7/2013 |
| WO | 2007/138909 A1 | 12/2007 |
| WO | 2013/094617 A1 | 6/2013 |
| WO | 2017/210531 A1 | 12/2017 |

OTHER PUBLICATIONS

Gu et al., "High-external-quantum-efficiency organic light-emitting devices", Opt. Lett., vol. 22, No. 6, pp. 396-398, 1997.

Taiwanese Patent Application No. 108119692, Summary of Official Letter dated Dec. 23, 2022, 2 pages (English Translation Only); Taiwanese Patent Office.

International Search Report and Written Opinion of the International Searching Authority; PCT/RU18/000370; dated Feb. 1, 2019; 11 Pages; European Patent Office.

Japanese Patent Application No. 2020-567820, Office Action, dated Jun. 29, 2022, 13 pages (6 pages of English Translation and 7 pages of Original Copy); Japanese Patent Office.

Chinese Patent Application No. 201880095432.1, Office Action dated Jul. 27, 2023, 4 pages (English Translation only), Chinese Patent Office.

* cited by examiner

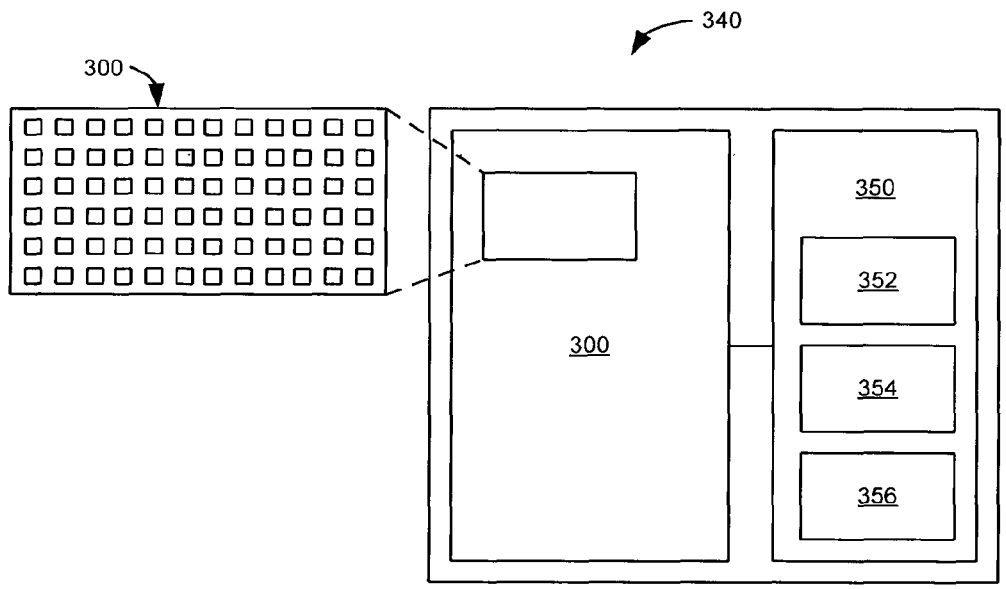
FIG. 9A
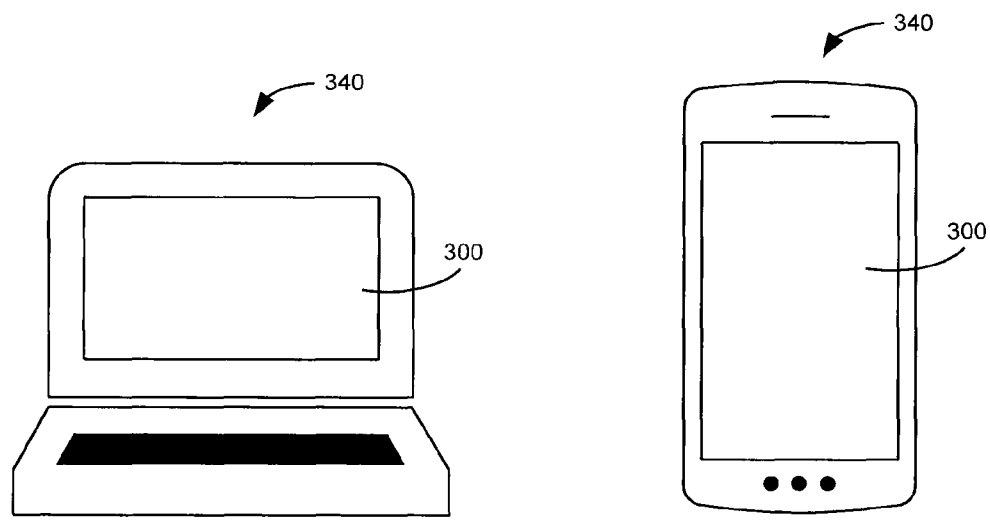
FIG. 9B
FIG. 9C

LIGHT EXTRACTION APPARATUS AND OLED DISPLAYS

This application is a National Stage application under 35 U.S.C. § 371 of International Application No. PCT/RU2018/000370, filed on Jun. 6, 2018, the content of which is relied upon and incorporated herein by reference in its entirety.

BACKGROUND

Field

The present disclosure relates generally to organic light-emitting diode (OLED) displays. More particularly, it relates to OLED displays and apparatus and methods for light extraction from OLED displays.

Technical Background

OLEDs typically include a substrate, a first electrode, one or more OLED light-emitting layers, and a second electrode. OLEDs can be top emitting or bottom emitting. A top-emitting OLED may include a substrate, a first electrode, an OLED structure having one or more OLED layers, and a second transparent electrode. The one or more OLED layers of the OLED structure may include an emission layer and can also include electron and hole injection layers and electron and hole transport layers.

Light emitted by the OLED structure is trapped by total internal reflection (TIR) wherever it passes from a layer with a higher refractive index to a layer with a lower refractive index, for example from the OLED structure that typically has a refractive index in the 1.7-1.8 range to a glass substrate that typically has an index of approximately 1.5, or from a glass substrate to air that has an index of 1.0.

To form a display, the OLEDs may be arranged on a display substrate and covered with an encapsulation layer. However, the light emitted from the OLEDs will once again be subject to TIR from the upper surface of the encapsulation layer even if the space between the encapsulation layer and the OLEDs is filled with a solid material. This further reduces the amount of OLED-generated light available for use in the OLED display.

SUMMARY

Some embodiments of the present disclosure relate to a light extraction apparatus for an organic light-emitting diode (OLED). The light extraction apparatus includes an OLED emitter, a plurality of tapered reflectors, and a spacer layer. Each tapered reflector includes a first surface, a second surface opposite to the first surface and comprising a surface area larger than a surface area of the first surface, and at least one side surface extending between the first surface and the second surface. The spacer layer includes a first surface coupled to the OLED emitter and a second surface coupled to the first surface of each of the plurality of tapered reflectors. Light emitted from the OLED passes through the spacer layer and into the plurality of tapered reflectors. The at least one side surface of each of the plurality of tapered reflectors includes a slope to redirect light by reflection into an escape cone and out of the second surface of the corresponding tapered reflector.

Yet other embodiments of the present disclosure relate to a bottom-emitting OLED display. The display includes a spacer layer, an array of tapered reflectors, and a substrate. The spacer layer is coupled to an array of OLEDs. Each OLED of the array of OLEDs has a bottom surface through which light is emitted into the spacer layer. At least two tapered reflectors of the array of tapered reflectors overlap each OLED of the array of OLEDs. Each tapered reflector of the array of tapered reflectors includes a first surface, a second surface opposite to the first surface and comprising a surface area larger than a surface area of the first surface, and at least one side surface extending between the first surface and the second surface. The first surface of each tapered reflector of the array of tapered reflectors is coupled to the spacer layer and facing the array of OLEDs. The substrate is coupled to the second surface of each tapered reflector of the array of tapered reflectors.

Yet other embodiments of the present disclosure relate to a top-emitting OLED display. The display includes a substrate, a spacer layer, an array of tapered reflectors, and an encapsulation layer. The substrate supports an array of OLEDs. Each OLED of the array of OLEDs has a top surface through which light is emitted. The spacer layer is coupled to the top surface of each OLED of the array of OLEDS. At least two tapered reflectors of the array of tapered reflectors overlap each OLED of the array of OLEDs. Each tapered reflector of the array of tapered reflectors includes a first surface, a second surface opposite to the first surface and comprising a surface area larger than a surface area of the first surface, and at least one side surface extending between the first surface and the second surface. The first surface of each tapered reflector of the array of tapered reflectors is coupled to the spacer layer and facing the array of OLEDs. The encapsulation layer is coupled to the second surface of each tapered reflector of the array of tapered reflectors.

OLED displays including the light extraction apparatus disclosed herein significantly improve the out-coupling of light from the displays and increase the efficiency and peak brightness of the displays. The external efficiency of OLED displays may be increased by a factor of 100% compared to displays not including the light extraction apparatus. Due to the increased external efficiency, the pixels of the display may be driven with less current for the same brightness, which increases the useful lifetime of the display and reduces the "burn-in" effect. Alternatively, or in addition, the pixels of the display may generate a higher peak brightness, which enables a high dynamic range (HDR). These capabilities are achieved while increasing the overall thickness of the displays by a few tens of microns. The light extraction apparatus is color-neutral, and therefore is equally beneficial for red, green, and blue pixels. In addition, the light extraction apparatus does not introduce optical scattering (i.e., haze) that can reduce sharpness and contrast. Further, the light extraction apparatus does not scramble the polarization state of light and is therefore compatible with the use of circular polarizers to reduce ambient light reflection.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 9A is a schematic diagram of a generalized electronic device that includes the OLED display disclosed herein; and FIGS. 9B and 9C are examples of the generalized electronic device of FIG. 9A.

DETAILED DESCRIPTION

Figure 1A:
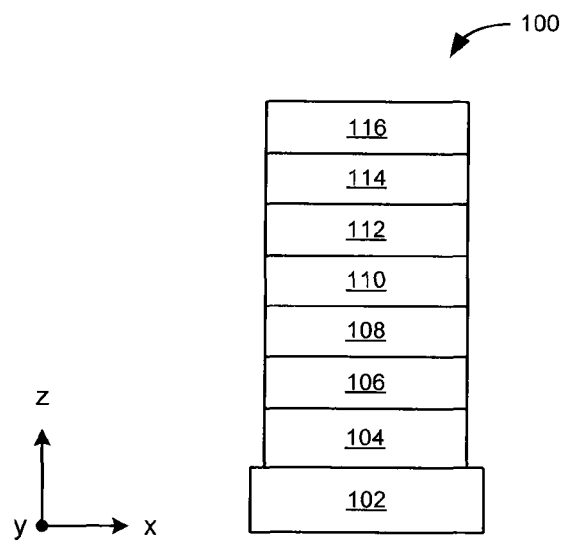
FIG. 1A schematically depicts an exemplary bottom-emitting organic light-emitting diode (OLED) structure.

Reference will now be made in detail to embodiments of the present disclosure, examples of which are illustrated in the accompanying drawings. Whenever possible, the same reference numerals will be used throughout the drawings to refer to the same or like parts. However, this disclosure may be embodied in many different forms and should not be construed as limited to the embodiments set forth herein.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom, vertical, horizontal—are made only with reference to the figures as drawn and are not intended to imply absolute orientation.

Unless otherwise expressly stated, it is in no way intended that any method set forth herein be construed as requiring that its steps be performed in a specific order, nor that with any apparatus, specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an," and "the" include plural references unless the context clearly dictates otherwise. Thus, for example, reference to "a" component includes aspects having two or more such components, unless the context clearly indicates otherwise.

Cartesian coordinates are used in the Figures for the sake of reference and ease of discussion and are not intended to be limiting as to orientation or direction.

The term "light extraction" in connection with an OLED refers to apparatus and method for increasing the amount of light emitted from the OLED using features that do not reside within the actual OLED layered structure.

The refractive index no of the OLED is an effective refractive index that includes contributions from the various layers that make up the OLED structure and in an example is in the range from about 1.6 to 1.85, while in another example is in the range from about 1.7 to 1.8, and in another example is in the range from about 1.76 to 1.78.

Referring now to FIG. 1A, an exemplary bottom-emitting OLED structure 100 is schematically depicted. Bottom-emitting OLED structure 100 includes a transparent substrate 102 (e.g., glass, plastic, etc.), a transparent anode 104 (e.g., ITO), and a cathode 116. In certain exemplary embodiments, cathode 116 may be made of a highly reflective metal, such as silver or aluminum. Between anode 104 and cathode 116, bottom-emitting OLED structure 100 may include a hole injection layer (HIL) 106, a hole transport layer (HTL) 108, an emission layer (EML) 110, an electron transport layer (ETL) 112, and an electron injection layer (EIL) 114. Bottom-emitting OLED structure 100 emits light through the bottom surface of anode 104 and through substrate 102.

Figure 1B:
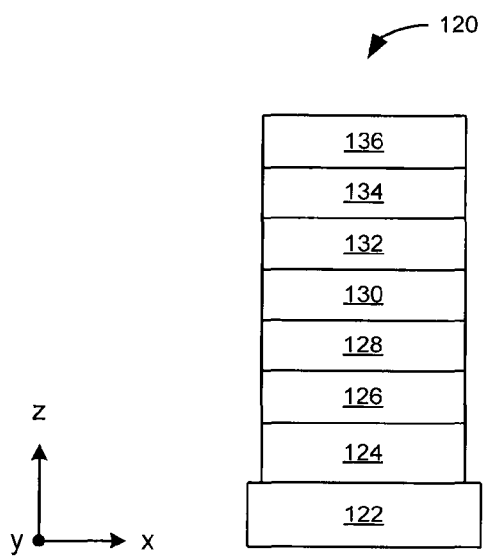
FIG. 1B schematically depicts an exemplary top-emitting OLED structure.

FIG. 1B schematically depicts an exemplary top-emitting OLED structure 120.

Top-emitting OLED structure 120 includes a substrate 122 (e.g., glass, plastic, etc.), an anode 124, and a transparent cathode 136 (e.g., an ultra-thin metal such as Al or Ag or an alloy such as Mg:Ag or Ba:Ag). In certain exemplary embodiments, top-emitting OLED structure 120 may also include a capping layer (e.g., $WO_3$) over cathode 136. Between anode 124 and cathode 136, top-emitting OLED structure 120 may include an HTL 126, an electron blocking layer (HBL) 128, an EML 130, a hole blocking layer (HBL) 132, and an ETL 134. Top-emitting OLED structure 120 emits light through the top surface of cathode 136.

Figure 2A:
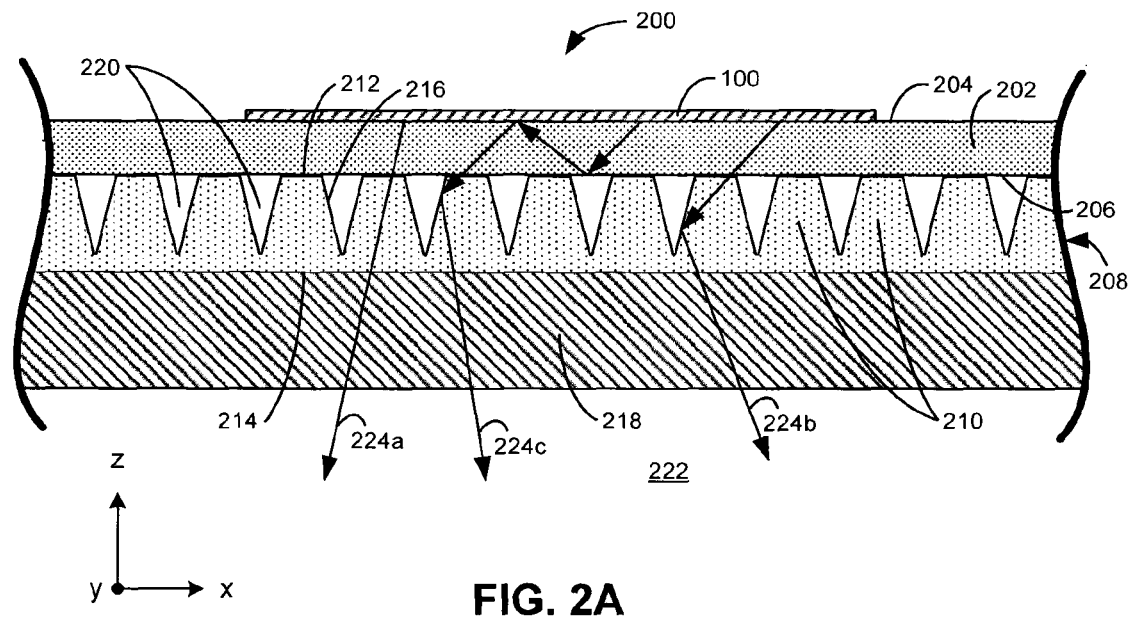
FIG. 2A depicts a cross-sectional view of a section of an exemplary bottom-emitting OLED display.

FIG. 2A depicts a cross-sectional view of a section of an exemplary bottom-emitting OLED display 200. OLED display 200 includes a bottom-emitting OLED 100, a spacer layer 202, an array 208 of tapered reflectors 210, and a substrate 218. A plurality (i.e., at least two) of the tapered reflectors 210 overlap OLED 100. In certain exemplary embodiments, at least two rows and at least two columns of tapered reflectors 210 (i.e., 4 tapered reflectors) overlap OLED 100. In other embodiments, at least three rows by five columns of tapered reflectors 210 (i.e., 15 tapered reflectors) overlap OLED 100. In yet other embodiments, at least ten rows by at least thirty columns of tapered reflectors 210 (i.e., 300 tapered reflectors) overlap OLED 100.

Each tapered reflector 210 includes a first surface 212 and a second surface 214 opposite to the first surface 212. The second surface 214 is larger (i.e., has a greater surface area) than the first surface 212. Each tapered reflector 210 also includes at least one side surface 216 extending between the first surface 212 and the second surface 214. In certain exemplary embodiments, each tapered reflector 210 of the array 208 of tapered reflectors has the form of a truncated pyramid having a trapezoidal cross-section as will be described in more detail below. Tapered reflectors 210 may be coupled to each other at the second surface 214 of each tapered reflector as shown in FIG. 2A such that the at least one side surface 216 of each tapered reflector does not extend completely to the second surface 214.

Spacer layer 202 includes a first surface 204 optically coupled to the bottom of OLED 100 and a second surface 206 optically coupled to the first surface 212 of each tapered reflector 210. In certain exemplary embodiments, spacer layer 202 has a thickness between about 10% and 100% of a length of the first surface 212 of each tapered reflector 210. The refractive index of the spacer layer 202 may be greater than or equal to the refractive index of the array 208 of tapered reflectors 210.

Substrate 218 is optically coupled to the second surface 214 of each tapered reflector 210. Substrate 218 may be made of glass, plastic, or another suitable transparent material. The refractive index of the array 208 of tapered reflectors 210 may be greater than or equal to the refractive index of the substrate 218. Light emitted from the OLED 100 passes through the spacer layer 202 and into the tapered reflectors 210. The at least one side surface 216 of each tapered reflector 210 includes a slope to redirect light by reflection into an escape cone and out of the second surface 214 of the corresponding tapered reflector 210. The light then passes through substrate 218 into an external environment 222.

Three light rays 224a, 224b, and 224c are shown in FIG. 2A. Light ray 224a propagates from the bottom of OLED 100 through spacer layer 202 and through a tapered reflector 210 directly to the second surface 214 of the tapered reflector, where the light propagates into substrate 218 and passes therethrough to external environment 222. Light ray 224b propagates from the bottom of OLED 100 through spacer layer 202 and through a tapered reflector 210 directly to a side surface 216 of the tapered reflector, where the light is reflected and redirected to the second surface 214 of the tapered reflector. Light ray 224b then propagates into substrate 218 and passes therethrough to external environment 222. Light ray 224c propagates from the bottom of OLED 100 into spacer layer 202 and directly to a portion of the second surface 206 of the spacer layer that is between tapered reflectors 210, where the light is reflected by TIR within the spacer layer. The light is reflected again by OLED 100 at the first surface 204 of spacer layer 202. Light ray 224c then passes again through spacer layer 202 and this time through a tapered reflector 210 directly to a side surface 216 of the tapered reflector, where the light is reflected and redirected to the second surface 214 of the tapered reflector. Light ray 224c then propagates into substrate 218 and passes therethrough to external environment 222. Additional details regarding the light propagation within OLED display 200 will be discussed below with reference to FIG. 4.

Figure 2B:
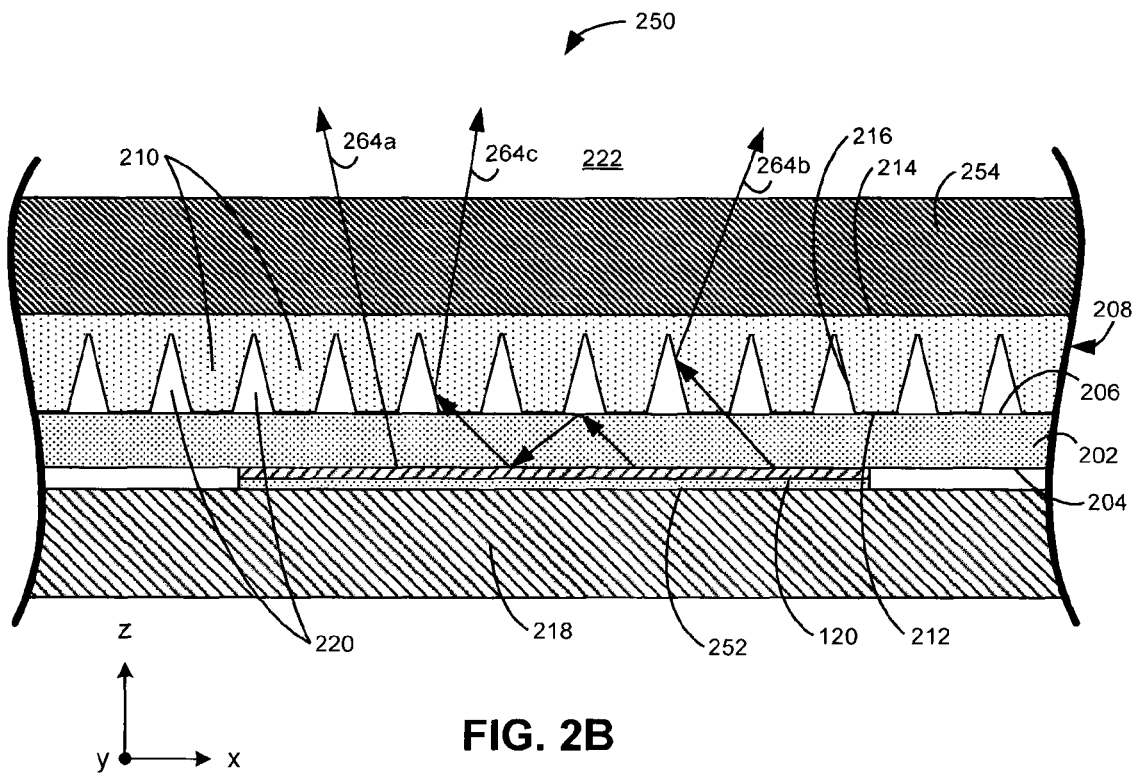
FIG. 2B depicts a cross-sectional view of a section of an exemplary top-emitting OLED display.

FIG. 2B depicts a cross-sectional view of a section of an exemplary top-emitting OLED display 250. OLED display 250 includes a top-emitting OLED 120, a metal contact 252, a substrate 218, a spacer layer 202, an array 208 of tapered reflectors 210, and an encapsulation layer 254. A plurality (i.e., at least two) of the tapered reflectors 210 overlap OLED 120. In certain exemplary embodiments, at least two rows and at least two columns of tapered reflectors 210 (i.e., 4 tapered reflectors) overlap OLED 120. In other embodiments, at least three rows by five columns of tapered reflectors 210 (i.e., 15 tapered reflectors) overlap OLED 120. In yet other embodiments, at least ten rows by at least thirty columns of tapered reflectors 210 (i.e., 300 tapered reflectors) overlap OLED 120.

Each tapered reflector 210 includes a first surface 212 and a second surface 214 opposite to the first surface 212. The second surface 214 is larger (i.e., has a greater surface area) than the first surface 212. Each tapered reflector 210 also includes at least one side surface 216 extending between the first surface 212 and the second surface 214. In certain exemplary embodiments, each tapered reflector 210 of the array 208 of tapered reflectors has the form of a truncated pyramid having a trapezoidal cross-section as will be described in more detail below. Tapered reflectors 210 may be coupled to each other at the second surface 214 of each tapered reflector as shown in FIG. 2B such that the at least one side surface 216 of each tapered reflector does not extend completely to the second surface 214.

Spacer layer 202 includes a first surface 204 optically coupled to the top of OLED 120 and a second surface 206 optically coupled to the first surface 212 of each tapered reflector 210. In certain exemplary embodiments, spacer layer 202 has a thickness between about 10% and 100% of a length of the first surface 212 of each tapered reflector 210. The refractive index of the spacer layer 202 may be greater than or equal to the refractive index of the array 208 of tapered reflectors 210.

Substrate 218 (e.g., glass, plastic, etc.) is coupled to OLED 120 via metal contact 252. Encapsulation layer 254 is optically coupled to the second surface 214 of each tapered reflector 210. Encapsulation layer 254 may be made of glass, plastic, or another suitable transparent material. The refractive index of the array 208 of tapered reflectors 210 may be greater than or equal to the refractive index of the encapsulation layer 254. Light emitted from the OLED 120 passes through the spacer layer 202 and into the tapered reflectors 210. The at least one side surface 216 of each tapered reflector 210 includes a slope to redirect light by reflection into an escape cone and out of the second surface 214 of the corresponding tapered reflector 210. The light then passes through encapsulation layer 254 into an external environment 222.

Three light rays 264a, 264b, and 264c are shown in FIG. 2B. Light ray 264a propagates from the top of OLED 120 through spacer layer 202 and through a tapered reflector 210 directly to the second surface 214 of the tapered reflector, where the light propagates into encapsulation layer 254 and passes therethrough to external environment 222. Light ray 264b propagates from the top of OLED 120 through spacer layer 202 and through a tapered reflector 210 directly to a side surface 216 of the tapered reflector, where the light is reflected and redirected to the second surface 214 of the tapered reflector. Light ray 264b then propagates into encapsulation layer 254 and passes therethrough to external environment 222. Light ray 264c propagates from the top of OLED 120 into spacer layer 202 and directly to a portion of the second surface 206 of the spacer layer that is between tapered reflectors 210, where the light is reflected by TIR within the spacer layer. The light is reflected again by OLED 120 at the first surface 204 of spacer layer 202. Light ray 264c then passes again through spacer layer 202 and this time through a tapered reflector 210 directly to a side surface 216 of the tapered reflector, where the light is reflected and redirected to the second surface 214 of the tapered reflector. Light ray 264c then propagates into encapsulation layer 254 and passes therethrough to external environment 222. Additional details regarding the light propagation within OLED display 250 will be discussed below with reference to FIG. 4.

Figure 3A:
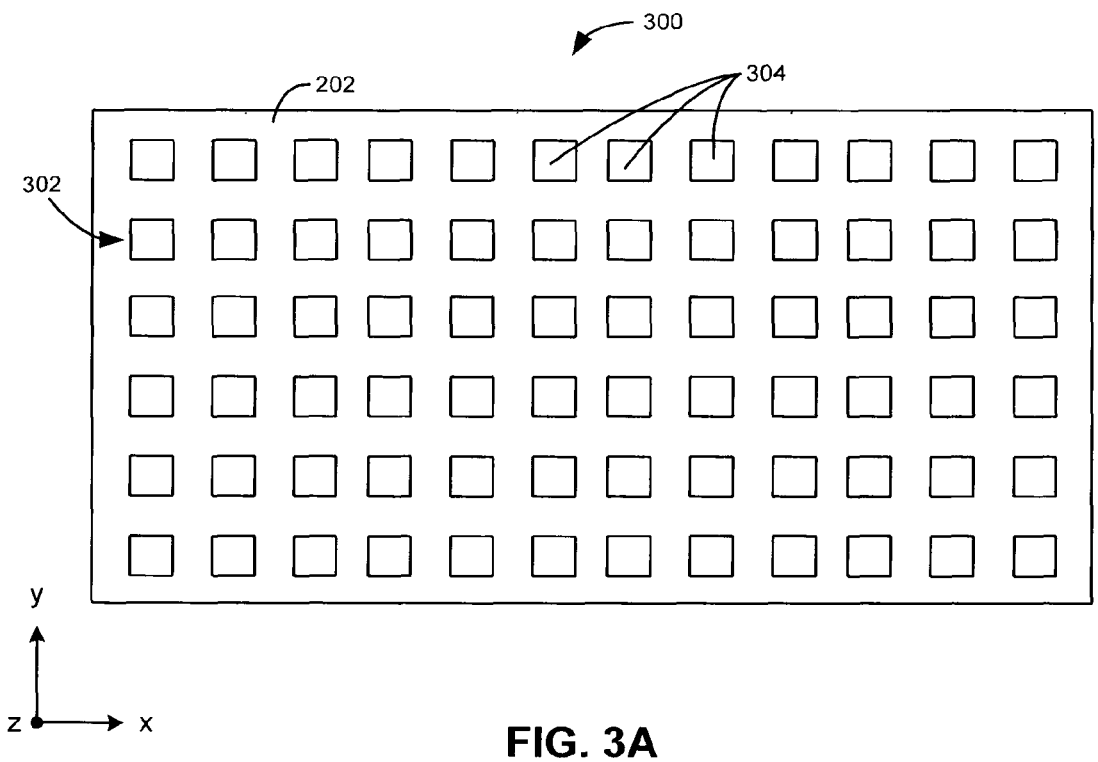
FIG. 3A is a top-down view of an exemplary OLED display that employs the light-extraction apparatus and methods disclosed herein.
Figure 3B:
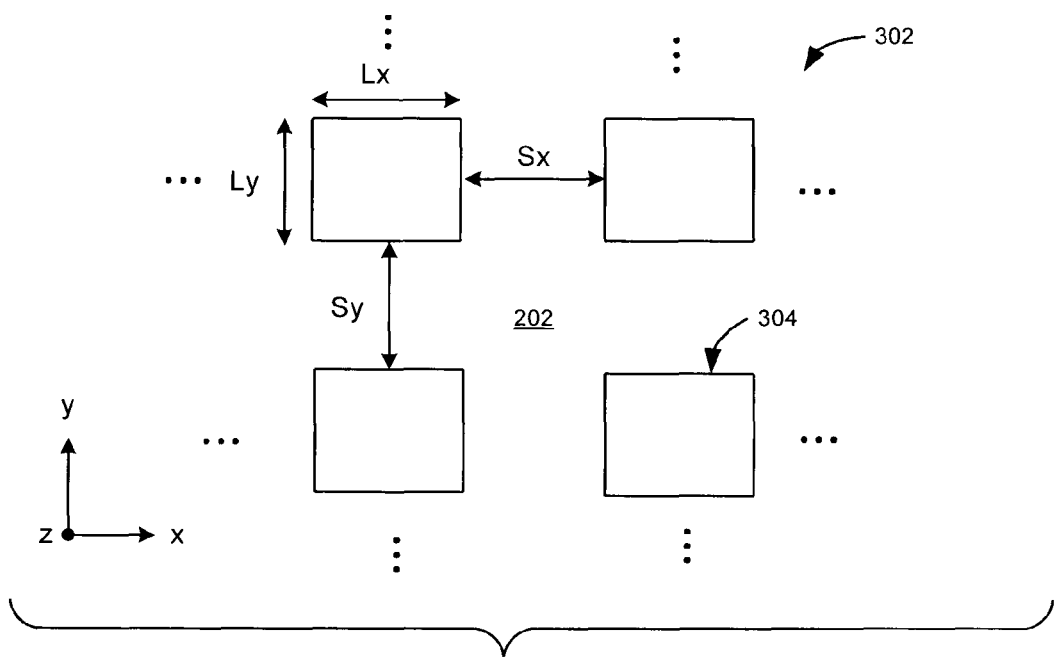
FIG. 3B is a top-down close-up view of an array of four OLEDs illustrating example dimensions of the OLEDs and the OLED array formed by the OLEDs.
Figure 4:
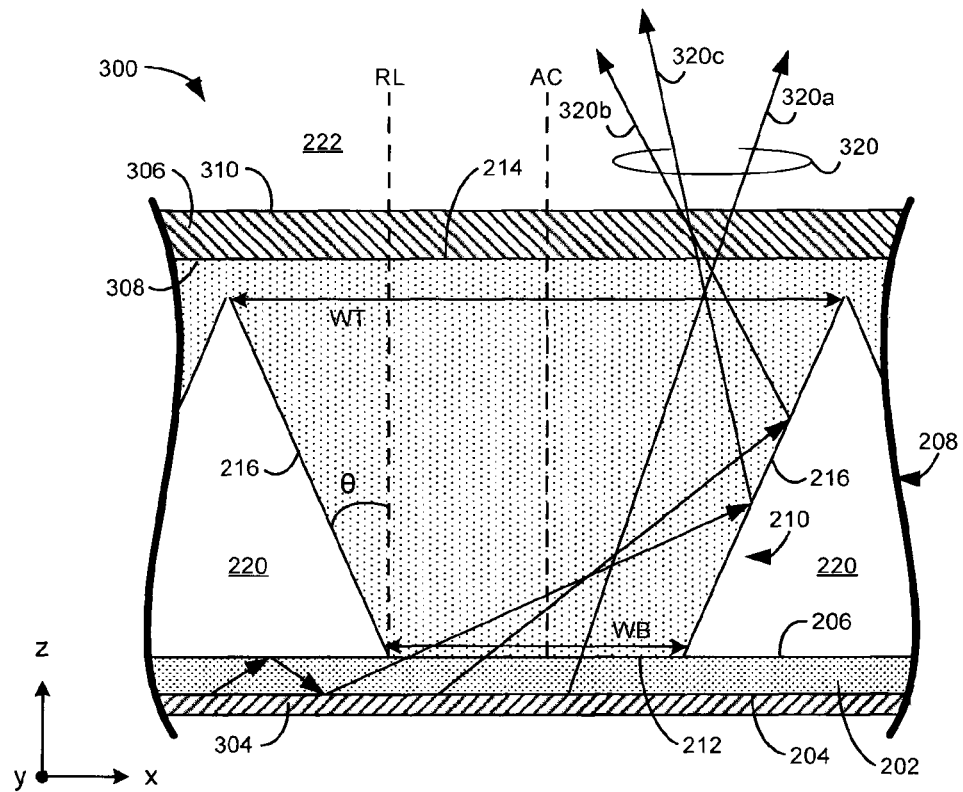
FIG. 4 is a close-up x-z cross-sectional view of a section of the OLED display of FIG. 3A.

FIG. 3A is a top-down view of an exemplary OLED display 300 that employs the light-extraction apparatus and methods disclosed herein. FIG. 3B is a close-up top-down view of a section of OLED display 300 while FIG. 4 is a close-up x-z cross-sectional view of a section of the OLED display 300. In one embodiment, OLED display 300 is a bottom-emitting OLED display and includes the OLED cross-display structure depicted in FIG. 2A. In another embodiment, OLED display 300 is a top-emitting OLED display and includes the OLED display structure depicted in FIG. 2B.

With reference to FIGS. 3A, 3B, and 4, the OLED display 300 includes an array 302 of OLEDs 304, a spacer layer 202, an array 208 of tapered reflectors 210, and a transparent layer 306. The array 302 of OLEDs 304 resides on the first surface 204 of spacer layer 202. In one embodiment, each OLED 304 is a bottom-emitting OLED, such as OLED 100 previously described and illustrated with reference to FIG. 1A. In another embodiment, each OLED 304 is a top-emitting OLED, such as OLED 120 previously described and illustrated with reference to FIG. 1B. In the case of each OLED 304 being a bottom-emitting OLED, transparent layer 306 is a substrate, such as substrate 218 previously described and illustrated with reference to FIG. 2A. Note that for the case of each OLED 304 being a bottom-emitting OLED, the z-axis orientation of OLED display 300 of FIG. 4 may be reversed to match the z-axis orientation of OLED display 200 of FIG. 2A. In the case of each OLED 304 being a top-emitting OLED, transparent layer 306 is an encapsulation layer, such as encapsulation layer 254 previously described and illustrated with reference to FIG. 2B. Note that for the case of each OLED 304 being a top-emitting OLED, the metal contact 252 and the substrate 218 of OLED display 250 of FIG. 2B have been excluded from OLED display 300 of FIG. 4 for simplicity.

As shown in FIG. 3B, the OLEDs 304 have a length Lx in the x-direction and a length Ly in the y-direction. In one embodiment, Lx equals Ly. The OLEDs 304 in OLED array 302 are spaced apart from each other in the x-direction and the y-direction by side-to-side spacings Sx and Sy. In one embodiment, Sx equals Sy. In one embodiment, the OLEDs 304 are all the same size and are equally spaced apart. In other embodiments, the OLEDs 304 do not all have the same dimensions Lx, Ly and the spacings Sx, Sy are not all the same. OLEDs 304 may each emit the same color of light or different colors of light, such as red, green, blue, and/or white. While OLEDs 304 are illustrated as having a rectangular arrangement, in other embodiments, OLEDs 304 may have a non-rectangular arrangement (e.g., diamond).

Figure 5:
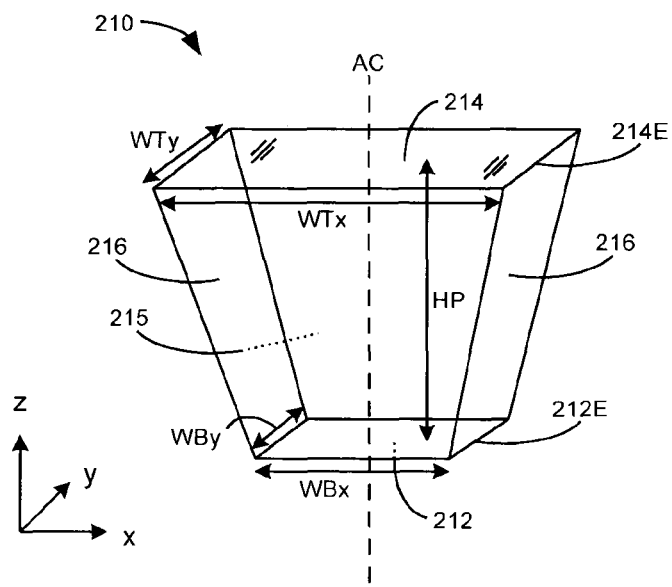
FIG. 5 is an elevated view of an exemplary tapered reflector.

Array 208 of tapered reflectors 210 is optically coupled to OLEDs 304 with at least two tapered reflectors 210 overlapping and optically coupled to each OLED 304. FIG. 5 is an elevated exploded view of an example tapered reflector 210. Each tapered reflector 210 includes a body 215, a first surface 212, at least one side surface 216, and a second surface 214. The first surface 212 includes at least one outer edge 212E, and the second surface 214 includes at least one outer edge 214E. The tapered reflector body 215 is made of a material having a refractive index $n_P$.

The second surface 214 of tapered reflector 210 is larger (i.e., has a greater surface area) than the first surface 212, i.e., the second surface is the "base" of the tapered reflector. In certain exemplary embodiments, the second surface 214 of tapered reflector 210 is at least 1.5 times as large in area as the first surface 212 of tapered reflector 210. In one embodiment, the first and second surfaces 212 and 214 are rectangular (e.g., square) so that there are a total of four side surfaces 216. In an example where tapered reflector 210 is rotationally symmetric, it can be said to have one side surface 216. Side surfaces 216 can each be a single planar surface or made of multiple segmented planar surfaces, or be a continuously curved surface.

Thus, in one example, tapered reflector 210 has the form of a truncated pyramid comprising a trapezoidal cross-section, also called an incomplete or truncated rectangular-based pyramid. Other shapes for tapered reflector 210 can also be effectively employed, as discussed below. The tapered reflector 210 has a central axis AC that runs in the z-direction. In the example where second (top) surface 214 and first (bottom) surface 212 have a square shape, the second surface 214 has a width dimension WT and the first surface 212 has a width dimension WB. More generally, the second surface 214 has (x, y) width dimensions WTx and WTy and first surface 212 has (x, y) width dimensions WBx and WBy. The tapered reflector 210 also has a height HP defined as the axial distance between the first surface 212 and the second surface 214.

In certain exemplary embodiments, tapered reflectors 210 are formed as a unitary, monolithic structure made of a single material. This can be accomplished using a molding process, imprinting process (e.g., ultraviolet or thermal imprinting), or like process, such as a microreplication process using a resin-based material.

As shown in FIG. 4, the first surface 212 of tapered reflector 210 is arranged on the second surface 206 of spacer layer 202. OLED 304 is arranged on the first surface 204 of spacer layer 202. Spacer layer 202 may include an index-matching material having a refractive index $n_{IM}$ and is used to interface tapered reflectors 210 to OLEDs 304. The tapered reflector refractive index $n_P$ is preferably, for example, as close as possible to the OLED refractive index $n_O$. In one embodiment, the difference between $n_p$ and $n_O$ is no more than about 0.3, more preferably no more than about 0.2, more preferably no more than about 0.1, and most preferably no more than about 0.01. In another embodiment, the index-matching material refractive index $n_{IM}$ is no lower than the tapered reflector refractive index $n_P$, and preferably has a value between $n_P$ and $n_O$. In an example, the tapered reflector refractive index $n_P$ is between about 1.6 and 1.8.

In one embodiment, the index-matching material of spacer layer 202 has an adhesive property and serves to attach tapered reflectors 210 to OLEDs 304. The index-matching material comprises, for example, an inorganic material, a glue, an optically clear adhesive, a bonding agent, or the like. The combination of each OLED 304, tapered reflectors 210, and spacer layer 202 define a light-emitting apparatus. The tapered reflectors 210 and spacer layer 202 define a light extraction apparatus.

The second surfaces 214 of tapered reflectors 210 are optically coupled to a first (lower) surface 308 of transparent layer 306. The second surfaces 214 of tapered reflectors 210 may tile the first surface 308 of transparent layer 306 without any substantial space in between second edges 214E. An external environment 222 exists immediately adjacent a second (upper) surface 310 of transparent layer 306. The external environment 222 is typically air, although it can be another environment in which one might use a display, such as vacuum, inert gas, etc.

With reference again to FIGS. 2A, 2B, and 4, the array 208 of tapered reflectors 210 defines confined spaces 220 between adjacent tapered reflectors and the second surface 206 of spacer layer 202. In certain exemplary embodiments, spaces 220 are filled with a medium such as air, while in other embodiments, the spaces are filled with a medium in the form of a dielectric material, such as a light absorbing (i.e., black) material. The filling of spaces 220 with a given medium of refractive index $n_S$ is discussed in greater detail below.

The tapered reflectors 210 are typically made of a material that has a relatively high refractive index, i.e., preferably as high as that of the OLED emission layer 110 (FIGS. 1A and 1B). The tapered reflectors 210 are operably arranged upon and overlap corresponding OLEDs 304 in an inverted configuration with the aforementioned spacer layer 202 therebetween. Each OLED 304 can be considered a pixel in OLED array 302, and each combination of OLED 304, spacer layer 202, and at least two tapered reflectors 210 is a light-emitting apparatus, with the combination of light-emitting apparatus defining an array of light-emitting apparatus for OLED display 300.

The OLEDs 304 emit light towards the first surface 212 of tapered reflectors 210. Because of the relatively high refractive index $n_P$ of the tapered reflectors 210 and the refractive index $n_{IM}$ of spacer layer 202, light rays 320 generated in the emission layer of OLED 304 can propagate from the OLED either directly or upon being reflected by the cathode of the OLED without being trapped by TIR. Three light rays 320a, 320b, and 320c are shown in FIG. 4. Light ray 320a propagates from OLED 304 through spacer layer 202 and through a tapered reflector 210 directly to the second surface 214 of the tapered reflector, where the light propagates into transparent layer 306 and passes therethrough to external environment 222. Light ray 320b propagates from the OLED 304 through spacer layer 202 and through a tapered reflector 210 directly to a side surface 216 of the tapered reflector, where the light is reflected and redirected to the second surface 214 of the tapered reflector. Light ray 320b then propagates into transparent layer 306 and passes therethrough to external environment 222. Light ray 320c propagates from the OLED 304 into spacer layer 202 and directly to a portion of the second surface 206 of the spacer layer that is between tapered reflectors 210, where the light is reflected by TIR within the spacer layer. The light is reflected again by OLED 304 at the first surface 204 of spacer layer 202. Light ray 320c then passes again through spacer layer 202 and this time through a tapered reflector 210 directly to a side surface 216 of the tapered reflector, where the light is reflected and redirected to the second surface 214 of the tapered reflector. Light ray 320c then propagates into transparent layer 306 and passes therethrough to external environment 222. In an example where the first surfaces 112 of tapered reflectors 210 cover about one fourth of the area of the second surface 206 of spacer layer 202, it will take on average about four reflections for the light ray to be able to exit the display 300.

In certain exemplary embodiments, side surfaces 216 have a slope defined by a slope angle θ relative to the vertical, e.g., relative to a vertical reference line RL that runs parallel to central axis AC, as shown. If the slope of sides 216 is not too steep (i.e., if the slope angle θ is sufficiently large), the TIR condition will be met for any point of origin of the light rays 320 entering tapered reflector 210 and no light rays will be lost by passing through sides 216 and into the spaces 220 immediately adjacent the sides of tapered reflector 210.

Moreover, if the height HP of tapered reflector 210 is sufficiently large, all of the light rays 320 incident upon the second surface 214 will be within a TIR escape cone 219 (FIG. 7B) defined by the refractive index $n_P$ of tapered reflector 210 and the refractive index $n_E$ of the transparent layer 306 and thus escape into the transparent layer 306. In addition, light rays 320 will also be within the TIR escape cone defined by the refractive index $n_E$ of the material of transparent layer 306 and the refractive index $n_e$ of the external environment 222 that resides immediately adjacent the second surface 310 of the transparent layer 306.

Thus, neglecting light absorption of the otherwise transparent anode in the OLED structure of OLED 304 and light absorption in spacer layer 202, 100% of light 320 generated by the OLED can in principle be communicated into the external environment 222 that resides above transparent layer 306. In essence, the index-matched material that makes up body 215 of each tapered reflector 210 allows for the tapered reflectors 210 to act as perfect (or near-perfect) internal light extractors while the reflective properties of sides 216 allow for the tapered reflectors to be perfect (or near-perfect) external light extractors.

Without the array 208 of tapered reflectors 210, the power coupled out of OLED display 300 would be about 30% of the source power for a well-designed OLED structure, and would not change significantly based on the thickness of spacer layer 202. With array 208 of tapered reflectors 210, the power coupled out of OLED display 300 increases as the thickness of spacer layer 202 increases until a maximum efficiency is reached. This change is due to how light rays 320 emitted from the OLEDs 304 propagate after they traverse the spacer layer 202.

Light rays outside the escape cone (that would be trapped within the display without tapered reflectors 210), such as light ray 320b, are redirected by TIR at the side surface 216 of the tapered reflector 210 and are now inside the escape cone and able to exit the display 300. Light rays, such as light ray 320c, outside the escape cone that strike the second surface 206 of spacer layer 202 between first surfaces 212 of adjacent tapered reflectors 210 are reflected by TIR back towards the OLED 304. The light rays are then reflected back towards the array 208 of tapered reflectors 210, where again the light rays can be either transmitted or reflected, depending upon where they strike.

For a very small thickness of the spacer layer 202, a light ray that on a first strike is mid-way between the first surfaces 212 of adjacent tapered reflectors 210 might need many bounces before the light ray strikes the first surface 112 of one of the tapered reflectors, and each time the light ray bounces back, some power is lost due to absorption in the OLED 304 and/or the spacer layer 202. As the thickness of the spacer layer grows, fewer bounces are needed for such light ray to travel laterally far enough to encounter a first surface 212 of a tapered reflector 210 and subsequently exit the display 300. Accordingly, the light extraction efficiency initially increases with an initial increase in the spacer layer thickness. The probability for the light ray to strike the first surface 212 of a tapered reflector 210 after a given number of bounces, however, does not change with a further increase in spacer layer thickness. Once the light extraction efficiency reaches a maximum, theoretically it should not change with a further increase in the thickness of the spacer layer 202.

By the logic presented above, it might seem that any thickness of the spacer layer 202 above a certain value would serve the purposes of the present disclosure well, in terms of achieving maximum possible light extraction efficiency. There is, however, another consideration to be taken into account. Since the light rays that are initially outside of the escape cone may travel an appreciable distance laterally after each bounce, this can lead to a "washing out" of the pixel, and may result in "cross-talk" between display pixels, reducing sharpness and eventually also contrast. Therefore, in certain exemplary embodiments, the optimum thickness of the spacer layer 202 is just large enough to reach the maximum efficiency but not any larger.

In certain exemplary embodiments for bottom-emitting OLED displays, the increase in external efficiency is about 60% compared to a bottom-emitting OLED display without an array 208 of tapered reflectors 210. In certain exemplary embodiments for top-emitting OLED displays, the increase in external efficiency is about 100% compared to a top-emitting OLED display without an array 208 of tapered reflectors 210. The actual improvement achieved depends upon the sequence and composition of the OLED 304 and the resulting interplay between the OLED's waveguiding properties and radiation dynamics of the light emitting dipole molecules, possibly including cavity effects that may be used to increase the light output in OLED displays.

Explanation of TIR Conditions

At the boundary of any two dissimilar transparent materials such as air and glass having refractive indices n1 and n2, respectively, light rays incident upon the boundary from the direction of the higher-index material will experience 100% reflection at the boundary and will not be able to exit into a lower index material if they are incident at the boundary at an angle to the surface normal which is higher than a critical angle $\theta$. The critical angle is defined by $\sin(\theta_c)=n1/n2$.

All light rays that are able to escape the higher-index material and not be subjected to TIR therein will lay within a cone having a cone angle of $2\theta_c$. This cone is referred to as the escape cone and discussed below in connection with FIG. 7B.

It can be shown that for any sequence of layers with arbitrary refractive indices, the critical angle $\theta_c$ and the escape cone 219 are defined by the refractive index of the layer where the light ray originates, and the refractive index of the layer or medium into which it escapes. Thus, an anti-reflective coating cannot be used to modify the TIR condition and cannot be used to aid light extraction by overcoming TIR conditions.

For a point source with isotropic emission into a hemisphere and the same intensity for any angle, the amount of light able to escape the source material is equal to the ratio of the solid angle of the escape cone 219 is given by $2\pi(1-\cos(\theta_c))$ and the full solid angle of the hemisphere ($2\pi$) is equal to $1-\cos(\theta_c)$. Taking an example of an OLED material with a refractive index n2=1.76 and air with refractive index n1=1.0, the critical angle is $\theta_c$=arcsin (1/1.76)=34.62°.

The amount of light that will exit into the air for any sequence of different material layers on top of the OLED material (i.e., the light output as compared to the light input) is equal to 1−cos(34.62°)=17.7%. This is referred to as the external light extraction efficiency LE. This result assumes the OLED is an isotropic emitter, but the estimate of the light extraction efficiency based on this assumption is very close to the actual result obtained with more rigorous analysis and what is observed in practice.

Tapered Reflector Shape Considerations

Figure 6A:
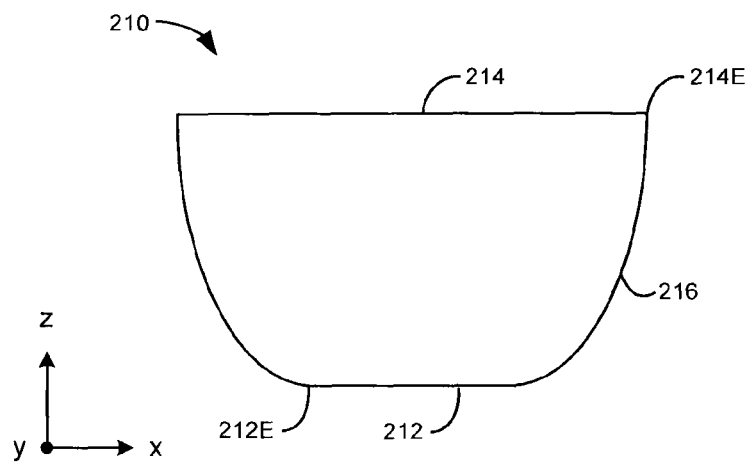
FIGS. 6A and 6B are side views of example shapes for the tapered reflectors.
Figure 6B:
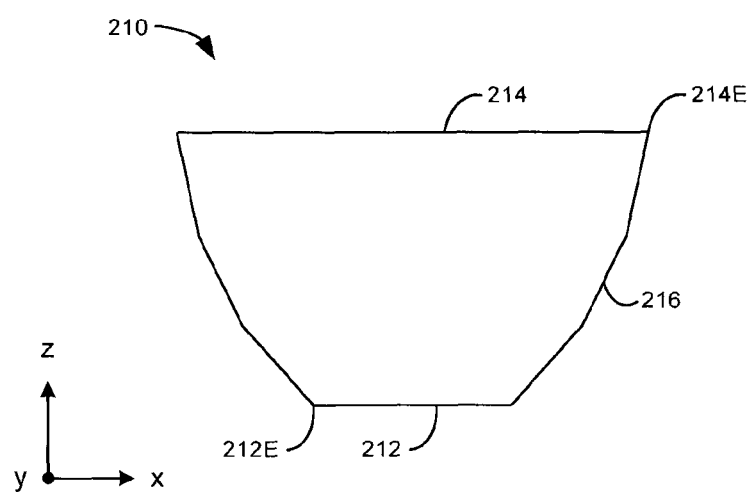

FIG. 6A is a side view of an exemplary tapered reflector 210 that includes at least one curved side surface 216. FIG. 6B is a side view of an embodiment of another tapered reflector 210 that includes at least one segmented planar side surface 216. In certain exemplary embodiments, one or more side surfaces 216 can be defined by a single curved surface, e.g., cylindrical, parabolic, hyperbolic, or any other shape besides planar, as long as tapered reflector 210 is wider at second surface 214 than at first surface 212. In one embodiment, tapered reflector 210 is rotationally symmetric and so includes a single side 216.

Figure 7A:
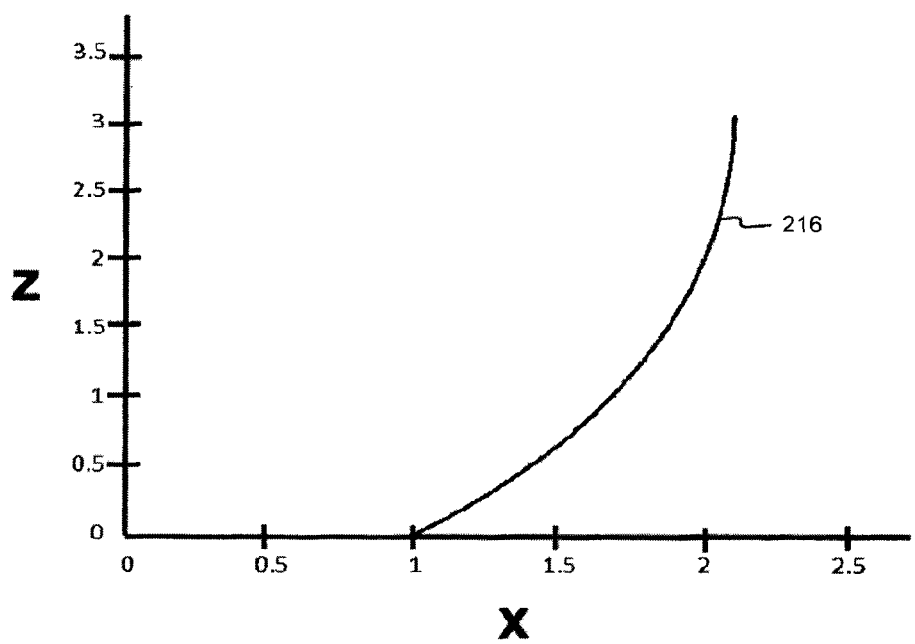
FIG. 7A is a plot of an example complex surface shape for a side of the tapered reflector, wherein the shape ensures that all of the light emitted by the OLED into the body of the tapered reflector and not directly hitting the top surface is subjected to total internal reflection at the side surface of the tapered reflector.

Although not strictly required, the performance of the light-emitting apparatus is optimized if at any point on side surface 216 of a tapered reflector 210 the TIR condition is observed for any possible point of origin of light entering the tapered reflector through the first surface 212 of the tapered reflector. FIG. 7A is a plot of the z coordinate vs. x coordinate (relative units) for an example complex surface shape for side surface 216 calculated using a simple numerical model. The z-axis and x-axis represent normalized lengths in the respective directions. The light originating from an OLED 304 and passing through the spacer layer 202 is assumed to extend in the x-direction from [−1, 0] to [1, 0], and there is another side 216 that starts at [−1, 0] location but that is not shown in the plot of FIG. 7A. The shape of side 216 was calculated such that rays originating at [−1, 0] are always incident on the surface exactly at 45° to a surface normal. Any other ray originating at z=0 and x between −1 and 1 will have a higher incidence angle on side 216 than the ray originating at [−1, 0].

Figure 7B:
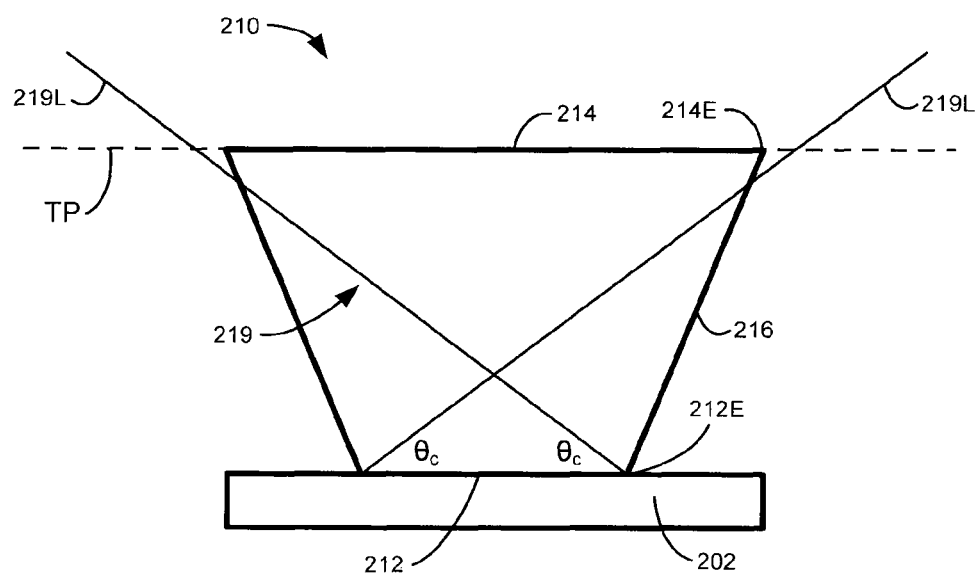
FIG. 7B is a schematic illustration of the advantageous shape of the tapered reflector, where the shape ensures that no light rays emitted by the OLED that are outside the escape cone for the tapered reflector material can directly hit the top surface of the tapered reflector, without first being reflected by the side walls of the tapered reflector.

Performance of the light-emitting apparatus can be further improved if the height HP of tapered reflector 210 is such that all of the light rays emitted by OLED 304 exiting directly into the transparent layer 306 are within the escape cone 219, as illustrated in the schematic diagram of FIG. 7B. FIG. 7B includes a plane TP defined by the second surface 214 of tapered reflector 210. The condition is met when second surface 214 of tapered reflector 210 is entirely within (i.e., not intersected by) the lines 219L that define the limits of the escape cone 219. The escape cone lines 219L originate at the edges 212E of first surface 212 and intersect plane TP at the critical angle $\theta_c$ with respect to second surface 214, where the value of $\theta_c$ is defined by the refractive index of the tapered reflector material $n_p$ and air $n_a$ as $\sin(\theta_c)=n_a/n_p$.

In a general case, there exists an optimum height HP of the tapered reflector 210 that depends on the geometry (size of and spacing between) OLEDs 304 and the refractive index $n_p$ of tapered reflectors 210. If the height HP is too small, all light rays emitted from the OLEDs 304 that fall at the side surfaces 216 of the tapered reflector 210 will undergo TIR, but some rays will go directly to the second surface 214 and be incident thereon at an angle larger than the critical angle and therefore will be trapped at the first boundary with air in the display. If the height HP is too large, all light rays going directly to the second surface 214 will be within the escape cone 219, but some light rays falling on the side surfaces 216 will be within the escape cone for the side surfaces and thus exit the side surfaces. In certain exemplary embodiments, the optimum height HP of the tapered reflectors HP is typically between (0.5) WB and 2WT, more typically between WB and WT. Also in one embodiment, the local slope of the side walls 216 can be between about 2° and 50°, or even between about 10° and 45°. In certain exemplary embodiments, the ratio of the width WB of first surface 212, the width WT of second surface 214, and the height HP of each tapered reflector 210 to each other is between about 1:2:1.4 and 1:2:1.8. For example, each tapered reflector 210 may have a 28×28 µm first surface 212, a 56×56 µm second surface 214, and a 42 µm height.

Tapered Reflector Array

As noted above, the plurality of tapered reflectors 210 define a tapered reflector array 208. The first surfaces 212 of the tapered reflectors 210 overlap with and are optically coupled to the emitting surfaces of OLEDs 304. Since the second surfaces 214 of tapered reflectors 210 are larger than the first surfaces 212, in one example (see FIG. 4) the second surfaces are sized to cover substantially the entire first surface 308 of transparent layer 306, or as close as the specific manufacturing technique employed allows.

The example OLED display 300 can be thought of as having a solid material layer residing immediately above spacer layer 202 with a thickness equal to the height HP of tapered reflectors 210 and with a rectangular grid of intersecting V-groove spaces 220 cut into the solid material layer. Such a structure can be microreplicated in a layer of suitable resin or a photocurable or thermally curable material, with a master replication tool configured to define a rectangular grid of triangular cross-section ridges. Such a tool, for example, can be manufactured by first diamond machining the pattern that looks exactly like the tapered reflector array, and then making a master by replicating an inverse pattern. The master can be metalized for durability.

If the second surface 214 of each tapered reflector is twice as large as the first surface 212, and the height HP of the tapered reflector is 1.5 times as tall as the bottom surface is wide, and the side walls are flat, then the slope angle θ of side surface 216 is arctan(⅓)=18.4°. Manufacturing tapered reflector 210 or an array 208 of tapered reflectors 210 having this slope angle is within the capability of diamond machining technology.

If the bottoms of the V-grooves are more rounded, then for the same slope angle θ, the height HP of tapered reflector 210 can be smaller than 1.5 times the size (dimension) of the first surface 212. For a different configuration of OLED display 300, or a different technique for making the replication masters, different restrictions on the geometry of the tapered reflectors may apply.

As explained above, to form a periodic array 208 of tapered reflectors 210, the replication tool or mold is a negative replica of the structure, which might be considered to be an array of truncated depressions or "bowls". When using such a tool for forming tapered reflector array 208, it may be preferred to avoid trapping air in the bowls when the tool is pressed into a layer of liquid or moldable replication material. One technique to avoid such air trapping is to manufacture a replication tool or mold as an array of complete and not truncated pyramidal bowls. In this case, the height of the tapered reflectors can be controlled by the thickness of the replication material layer. The tool is pressed in the replication material until in comes in contact with transparent layer 306. Air pockets will be left above each of the replicated tapered reflectors on purpose. Care can be taken to avoid rounding of the tapered reflector tops by surface tension.

The improved light-emission apparatus and methods disclosed herein rely entirely on light reflection and not light scattering. Thus, the polarization of ambient light reflected by a reflective cathode of an OLED is unchanged upon reflection, which means that the approach is perfectly compatible with the use of circular polarizers. Also, there is no haze in reflection and therefore no decrease of the display contrast ratio, which is a problem characteristic of almost all other approaches to improving light extraction using scattering techniques.

Resin Tapered Reflectors

As noted above, in one embodiment the array 208 of tapered reflectors 210 can be formed using a resin since resins are amenable to molding processes and like mass-replication techniques. When forming the array 208 using a resin, it is preferred that edges of transparent layer 306 be free of resin so that it can be coated by a frit for edge sealing. In addition, it is preferred that the resin be able to survive a 150° C. processing temperature typical of making touch sensors. Also, it is preferred that the resin exhibit no or extremely low outgassing within the operating temperature range, at least of the type most detrimental for OLED materials, namely oxygen and water.

Material for the Spaces Between the Tapered Reflectors

As noted above, the array 208 of tapered reflectors 210 and spacer layer 202 define confined spaces 220 filled with a medium having a refractive index $n_S$. In certain exemplary embodiments, the confined spaces 220 are filled with air, which has a refractive index of $n_S=n_a=1$. In other embodiments, spaces 220 can be filled with a solid material. It is generally preferred that the medium within spaces 220 has as low a refractive index as possible so that escape cone 219 stays as large as possible.

To achieve the best possible light extraction benefit, it is preferable that the index $n_S$ of the filler material be 1.2 or smaller. An example of a material with such a low refractive index is aerogel, which is porous organic or inorganic matrix filled with air or other suitable dry and oxygen-free gas. A silica-based aerogel can also serve an additional role of absorbing any residual water contamination, increasing the lifetime of the OLED materials. If the material making up the body 215 of each tapered reflector 210 has a refractive index $n_P$ of 1.7 and the refractive index of aerogel is 1.2, then the critical angle $\theta_c$ will be about 45°, which is an acceptable critical angle.

Tapered Reflector Modifications

The tapered reflectors 210 can be modified in a number of ways to enhance the overall light extraction efficiency. For example, in one embodiment side surfaces 216 can include a reflective coating. This configuration allows for essentially any transparent material to fill spaces 220 since the tapered reflectors 210 no longer operate using TIR.

Figure 8A:
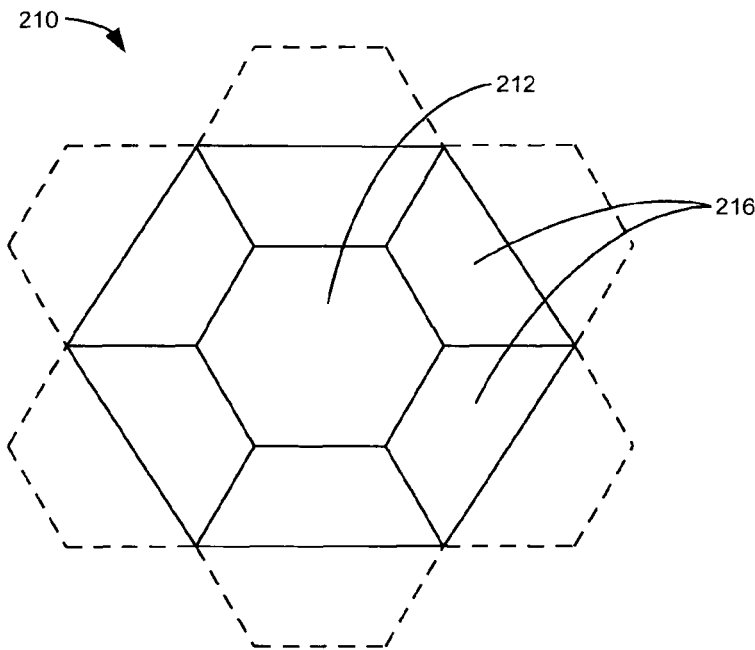
FIGS. 8A and 8B are top views of example shapes for the tapered reflectors.

FIG. 8A is a top view of an exemplary hexagonal shape for tapered reflectors 210. In this example, each tapered reflector 210 includes a hexagon shaped first surface 212 and six side surfaces 216 extending from the first surface 212 to a hexagon shaped second surface. The dashed lines in FIG. 8A represent the side surfaces 216 of adjacent tapered reflectors 210 in an array of tapered reflectors.

Figure 8B:
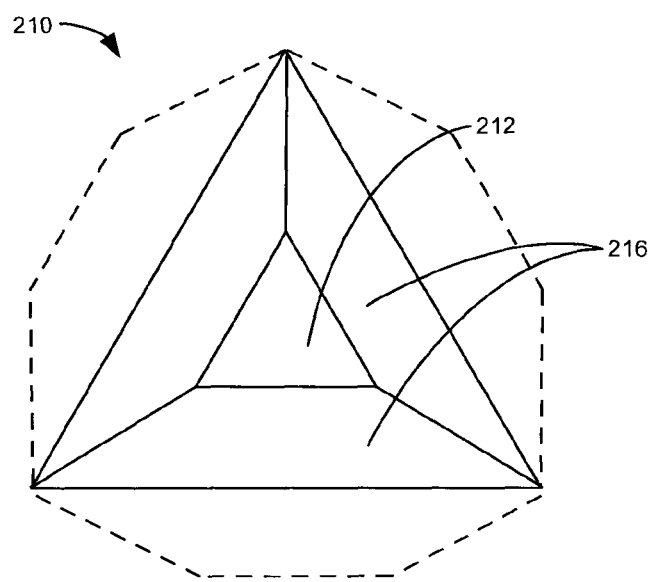

FIG. 8B is a top view of an exemplary triangular shape for the tapered reflectors 210. In this example, each tapered reflector 210 includes a triangle shaped first surface 212 and three side surfaces 216 extending from the first surface 212 to a triangle shaped second surface. The dashed lines in FIG. 8B represent the side surfaces 216 of adjacent tapered reflectors 210 in an array of tapered reflectors.

Electronic Devices Utilizing the OLED Display

The OLED displays disclosed herein can be used for a variety of applications including, for example, in consumer or commercial electronic devices that utilize a display. Example electronic devices include computer monitors, automated teller machines (ATMs), and portable electronic devices including, for example, mobile telephones, personal media players, and tablet/laptop computers. Other electronic devices include automotive displays, appliance displays, machinery displays, etc. In various embodiments, the electronic devices can include consumer electronic devices such as smartphones, tablet/laptop computers, personal computers, computer displays, ultrabooks, televisions, and cameras.

FIG. 9A is a schematic diagram of a generalized electronic device 340 that includes OLED display 300 as disclosed herein. The generalized electronic device 340 also includes control electronics 350 electrically connected to OLED display 300. The control electronics 350 can include a memory 352, a processor 354, and a chipset 356. The control electronics 350 can also include other known components that are not shown for ease of illustration.

FIG. 9B is an elevated view of an example electronic device 340 in the form of a laptop computer. The laptop computer includes an OLED display 300 as disclosed herein. FIG. 9C is a front-on view of an example electronic device 340 in the form of a smart phone. The smart phone includes an OLED display 300 as disclosed herein.

It will be apparent to those skilled in the art that various modifications and variations can be made to embodiments of the present disclosure without departing from the spirit and scope of the disclosure. Thus it is intended that the present disclosure cover such modifications and variations provided they come within the scope of the appended claims and their equivalents.

What is claimed is:

1. A light extraction apparatus for an organic light-emitting diode (OLED) comprising:
    an OLED emitter comprising a single emission layer;
    a plurality of tapered reflectors overlapping the OLED emitter, each tapered reflector comprising a first surface, a second surface opposite to the first surface and comprising a surface area larger than a surface area of the first surface, and at least one side surface extending between the first surface and the second surface; and
    a spacer layer comprising a first surface coupled to the OLED emitter and a second surface coupled to the first surface of each of the plurality of tapered reflectors,
    wherein light emitted from the OLED passes through the spacer layer and into the plurality of tapered reflectors,
    wherein the at least one side surface of each of the plurality of tapered reflectors comprises a slope to redirect all light incident on the at least one side surface into an escape cone and out of the second surface of the corresponding tapered reflector, and
    wherein all light rays emitted by the OLED emitter outside the escape cone that strike the second surface of the spacer layer between the first surfaces of adjacent tapered reflectors are reflected by total internal reflection (TIR) back towards the OLED emitter.

2. The light extraction apparatus of claim 1, wherein each of the plurality of tapered reflectors comprises a truncated pyramid comprising a trapezoidal cross-section.

3. The light extraction apparatus of claim 1, wherein the plurality of tapered reflectors comprises a two-dimensional array of tapered reflectors arranged in at least two rows and at least two columns.

4. The light extraction apparatus of claim 1, wherein a refractive index of the spacer layer is greater than or equal to a refractive index of the plurality of tapered reflectors.

5. The light extraction apparatus of claim 1, wherein the spacer layer comprises an inorganic material.

6. The light extraction apparatus of claim 1, wherein the spacer layer comprises an optically clear adhesive.

7. The light extraction apparatus of claim 1, wherein the surface area of the second surface of each of the plurality of tapered reflectors is at least 1.5 times as large as the surface area of the first surface of each of the plurality of tapered reflectors.

8. The light extraction apparatus of claim 1, further comprising:
    a substrate coupled to the second surface of each tapered reflector of the plurality of tapered reflectors.

9. The light extraction apparatus of claim 8, wherein the refractive index of the plurality of tapered reflectors is greater than or equal to a refractive index of the substrate.

10. The light extraction apparatus of claim 1, wherein the spacer layer comprises a thickness between 10% and 100% of a length of the first surface of each tapered reflector of the plurality of tapered reflectors.

11. The light extraction apparatus of claim 1, further comprising:
    an encapsulation layer coupled to the second surface of each tapered reflector of the plurality of tapered reflectors.

12. The light extraction apparatus of claim 11, wherein the refractive index of the plurality of tapered reflectors is greater than or equal to a refractive index of the encapsulation layer.

13. The light extraction apparatus of claim 1, wherein the at least one side surface of each of the plurality of tapered reflectors comprises a segmented planar side surface.

14. The light extraction apparatus of claim 1, wherein the first surface of each tapered reflector comprises a hexagon shape and the second surface of each tapered reflector comprises a hexagon shape.

15. The light extraction apparatus of claim 1, wherein the first surface of each tapered reflector comprises a triangle shape and the second surface of each tapered reflector comprises a triangle shape.

16. A light extraction apparatus for an organic light-emitting diode (OLED) comprising:
    an OLED emitter comprising a single emission layer;
    a plurality of tapered reflectors overlapping the OLED emitter, each tapered reflector comprising a first surface, a second surface opposite to the first surface and comprising a surface area larger than a surface area of the first surface, and at least one side surface extending between the first surface and the second surface;
    a spacer layer comprising a first surface coupled to the OLED emitter and a second surface directly coupled to the first surface of each of the plurality of tapered reflectors; and
    a dielectric material completely filling spaces between the plurality of tapered reflectors and the second surface of the spacer layer,
    wherein light emitted from the OLED passes through the spacer layer and into the plurality of tapered reflectors,
    wherein the at least one side surface of each of the plurality of tapered reflectors comprises a slope to redirect light into an escape cone and out of the second surface of the corresponding tapered reflector, and
    wherein all light rays emitted by the OLED emitter outside the escape cone that strike the second surface of the spacer layer between the first surfaces of adjacent tapered reflectors are reflected by total internal reflection (TIR) back towards the OLED emitter.

17. The light extraction apparatus of claim 16, wherein the slope of the at least one side surface of each of the plurality of tapered reflectors is to redirect all light incident on the at least one side surface into the escape cone and out of the second surface of the corresponding tapered reflector.

18. The light extraction apparatus of claim 16, wherein the dielectric material comprises a light absorbing material.

19. The light extraction apparatus of claim 16, wherein the dielectric material comprises an aerogel.

20. The light extraction apparatus of claim 16, wherein a refractive index of the dielectric material is less than or equal to 1.2.

* * * * *